(12) United States Patent
Hesketh

(10) Patent No.: US 9,251,451 B2
(45) Date of Patent: Feb. 2, 2016

(54) PROVIDING LOCALITY INFORMATION VIA LIGHT SOURCES

(71) Applicant: James Hesketh, London (GB)

(72) Inventor: James Hesketh, London (GB)

(73) Assignee: Rackspace US, Inc., San Antonio, TX (US)

( * ) Notice: Subject to any disclaimer, the term of this patent is extended or adjusted under 35 U.S.C. 154(b) by 314 days.

(21) Appl. No.: 13/722,439

(22) Filed: Dec. 20, 2012

(65) Prior Publication Data

US 2014/0176947 A1  Jun. 26, 2014

(51) Int. Cl.
| | | |
|---|---|---|
| *G01J 3/28* | (2006.01) | |
| *G08B 21/00* | (2006.01) | |
| *G06K 19/06* | (2006.01) | |
| *H05K 7/20* | (2006.01) | |
| *H05K 7/14* | (2006.01) | |
| *G06F 3/0484* | (2013.01) | |

(52) U.S. Cl.
CPC ........ *G06K 19/06037* (2013.01); *G06F 3/0484* (2013.01); *H05K 7/1498* (2013.01); *H05K 7/20836* (2013.01)

(58) Field of Classification Search
CPC . H05K 7/1498; H05K 7/20836; G06F 3/0484
See application file for complete search history.

(56) References Cited

U.S. PATENT DOCUMENTS

| | | | |
|---|---|---|---|
| 2003/0197619 A1 | 10/2003 | Lawrence et al. | |
| 2005/0151660 A1* | 7/2005 | Mou | 340/679 |
| 2011/0239056 A1 | 9/2011 | Adams | |
| 2013/0073882 A1* | 3/2013 | Inbaraj et al. | 713/320 |

FOREIGN PATENT DOCUMENTS

JP    11266088 A  *  9/1999  ............... H05K 7/14

OTHER PUBLICATIONS

Machine Translation of JP11266088 document published Sep. 1999.*

* cited by examiner

*Primary Examiner* — Benjamin C Lee
*Assistant Examiner* — Rajsheed Black-Childress
(74) *Attorney, Agent, or Firm* — Trop, Pruner & Hu, P.C.

(57) ABSTRACT

In an embodiment, an apparatus includes a rack having a plurality of rack-mounted devices and a strip coupled to a portion of the rack and including a plurality of segments, each with a light source. The rack-mounted devices may each include or be associated with a photosensor to be in communication with the light source.

16 Claims, 4 Drawing Sheets

PROVIDING LOCALITY INFORMATION VIA LIGHT SOURCES

BACKGROUND

In many datacenters, a large amount of computing equipment is present including servers, storages devices, switches or other load balancers and so forth. To maintain an accurate inventory system, a great deal of time and expense is involved in identifying each of the pieces of equipment with a unique identifier, such as a readable barcode and storing information regarding each such piece of equipment in an inventory database. Often times a large amount of manual effort is required to populate this database and to effect updates, e.g., when additional equipment is installed into the datacenter or old equipment is removed.

Another issue in datacenters is remote monitoring of the equipment to identify when a particular piece of equipment is suffering from a fault or other abnormal condition. While remote monitoring systems are available, typically they are very complex and require a great deal of interoperable parts to enable their proper operation.

SUMMARY OF THE INVENTION

Figure 1:
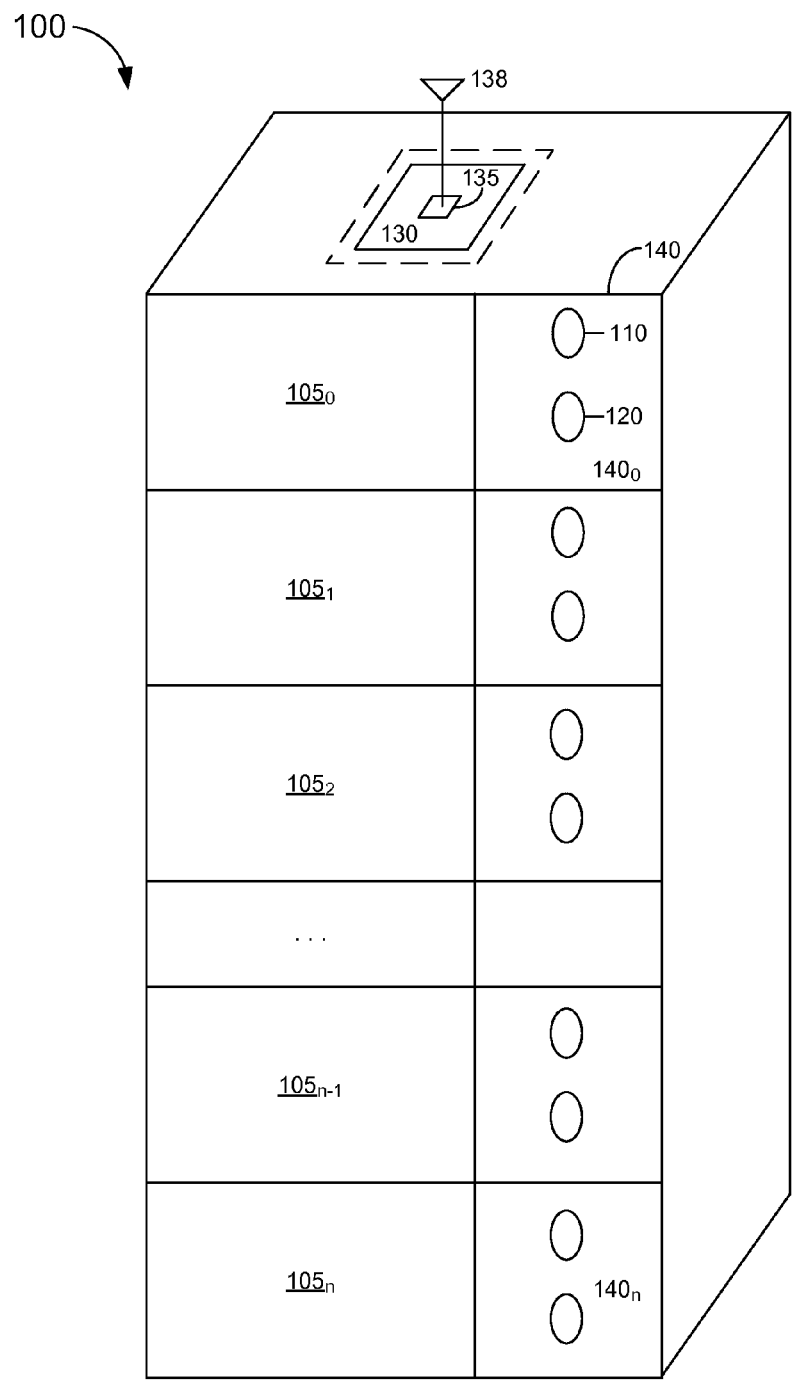
FIG. 1 is a block diagram of a rack of a datacenter in accordance with an embodiment of the present invention.

In an embodiment, an apparatus includes a rack having a plurality of rack-mounted devices and a strip coupled to a front portion of the rack and including a plurality of segments, each with a light source. The rack-mounted devices may each include or be associated with a photosensor to be in communication with the light source. This photosensor can be used to determine a color of light output by the light source. As one example, a rack-mounted device may perform a configuration operation responsive to the color of light.

The light source may be a plurality of light emitting diodes (LEDs) each of a primary color. And a lens may be adapted about the LEDs to blend the primary colors to obtain the color. A color of light output by the light source may be indicative of a type of the corresponding rack-mounted device.

In some embodiments, each of the segments of the strip further includes a second photosensor, and where each of the plurality of rack-mounted devices further includes or is associated with a second light source.

In one embodiment, the strip is coupled to a management controller of the rack that in turn is to wirelessly communicate with a datacenter management system. This system may communicate information to the management controller to cause a first color to be output by the light source of a first segment of the strip. Then responsive to the first color, the corresponding rack-mounted device is to perform a reconfiguration to a different type of resource.

In another embodiment, a method includes: controlling a light source associated with a rack-mounted device of a rack to be of a first color to identify that the rack-mounted device is of a first type of device; detecting the first color in a photosensor associated with a segment of the rack including the rack-mounted device and communicating information regarding the first color to a management controller of the rack; and communicating location information regarding the rack and the first color information to a datacenter management system from the management controller.

The type of the rack-mounted device may be determined within a controller of the rack-mounted device, and the first color may be associated with the type via a mapping table stored in the controller.

In an embodiment, location information and the color information can be communicated to the datacenter management system wirelessly to provide inventory information regarding the rack. This location information may include a MAC address of a wireless module of the rack. Embodiments may be used to identify a failure in the rack-mounted device, and control the light source to be of a second color to identify the failure in the rack-mounted device.

In a still further embodiment, a system includes a datacenter rack having a plurality of rack-mounted devices and a strip coupled to a first potion of the rack and including a plurality of segments, each associated with a light source and a photosensor in communication with the light source, where the photosensor is to detect the information output by the light source. This, and other racks may be coupled to a datacenter management system via a management controller of the corresponding rack. The datacenter management system may communicate information to a given device of the rack via a first light source and a first photosensor associated with the device.

DETAILED DESCRIPTION

In various embodiments, a light sensing system may be provided to enable a variety of different information regarding rack-mounted equipment within a datacenter to be communicated in a simple and low complexity manner. In addition, in certain implementations realtime location information regarding equipment within the datacenter can be obtained, avoiding the need for a complex inventory database of available equipment. However understand that in other implementations, the location-based information via light sensing can be used in connection with an inventory database.

In particular implementations described herein, one or more photosensors can be associated with each piece of rack-mounted equipment to enable identification of the location of the equipment, as well as to indicate a type of equipment. As such a role-based identification of each piece of equipment in a datacenter can be provided where a unique color is associated with each type of equipment. From this information provided by a color caused to be output by a light source associated with a piece of equipment, a realtime inventory of a rack or other portion of a datacenter can be dynamically obtained. Still further in some implementations via these photosensors and corresponding light sources, operational information regarding the equipment such as a basic health status of the equipment can be identified. To this end, each piece of equipment may include hardware, software or firmware such as a controller to communicate information regarding a type of the equipment, its status and/or other information, in the form of one or more unique colors to a corresponding light source. In turn, a photosensor associated with this light source can detect the color and report the same, e.g., to a datacenter management system. It is also possible to provide control information to the equipment via this light source/photosensor system.

Thus in many implementations, a two-way system of light sources and corresponding photosensors may be provided to enable a flow of one or more types of information in multiple directions, namely from a management system of a datacenter to the corresponding rack-mounted equipment (downstream direction), and in the other direction (upstream direction) from the equipment to the datacenter management system. However, other implementations may provide for a single set of light sources and corresponding photosensors such that only a single direction of information flow can occur.

Referring now to FIG. 1, shown is a block diagram of a rack of a datacenter in accordance with an embodiment of the present invention. As shown in FIG. 1, rack 100 may be a conventional datacenter rack including a plurality of shelves or other support structures 105 each to support one or more pieces of rack-mounted equipment. As examples, each of a plurality of shelves may be of a standard, e.g., so-called U-height and can be configured to support a variety of equipment such as a chassis that includes one or more server computers, switches, storage devices, load balancers among many other types of equipment.

In the embodiment shown in FIG. 1, on one side of the rack structure, e.g., on a front edge of the rack a plurality of segments can be provided, each including a photosensor and a light source. In the embodiment shown, a photosensor 110 and a light source 120 may be present for each individual segment. In various embodiments different types of photosensors and light sources may be provided. As an example, the light sources may be light emitting diodes (LEDs) where each such light source may be implemented as a plurality of LEDs, namely three LEDs, each corresponding to a primary color. In this way, a wide variety of different colors can be created by appropriate combinations of these three primary colors. Of course understand the scope of the present invention is not limited in this regard and in other embodiments more or fewer individual LEDs may be provided that can be configured as primary colors or any other type of color. In addition, a photosensor 110 is provided. This photosensor may be configured to detect light being emitted from a corresponding light source that is associated with a piece of rack-mounted equipment that is mounted within the support unit.

In a given embodiment these light sources and photosensors can be configured on a strip of material, e.g., of a metal, plastic or any other type of material that can be adapted to a side of rack 100. In some embodiments to provide ease of reading the information from the light source, a lens such as a frosted lens may be placed over the corresponding light source to enable blending of the multiple LEDs to thus output a selected color.

In the example of FIG. 1, a strip 140 can be provided including a plurality of segments $140_0$-$140_n$, each including a light source and a photosensor (in embodiments in which two way communication is desired). In a system for one way communication, only a single one of these light sources and photosensors is provided. This strip 140 can be configured to one of the sides of rack 100 by any desired attachment mechanism. Note that each segment 140 can be associated with a particular piece of rack-mounted equipment. However, in situations such as where a multiple U-height piece of equipment is present, multiple segments may be associated with that piece of equipment. Or a single such segment can be used to correspond to this multi-U-height equipment.

To enable communication with a datacenter management system, the information directed to cause the light source to be of a particular color and information (namely color) identified by a photosensor can be communicated to the datacenter management system in various manners. For example, each light source and photosensor can be coupled in a wired manner to a consolidation point within the rack, such as a management control board, e.g., located at a top portion of the rack. In turn, this board can communicate with the datacenter management system via wireless communication, in some embodiments. In this example, management control board 130 can include a wireless module 135 coupled to an antenna 138, which may be located on an external portion of the rack. In an implementation with wireless communication, a MAC address is associated with the management control board that provides location information of the rack. As such, information communicated in an upstream direction can provide this location information along with, in some embodiments, an identification of which photosensor detected the color, to enable the datacenter management system to ascertain an exact location of a device within the rack. Similarly, to effect communication in a downstream direction, the same MAC address may be used to direct the communication appropriately.

Figure 2:
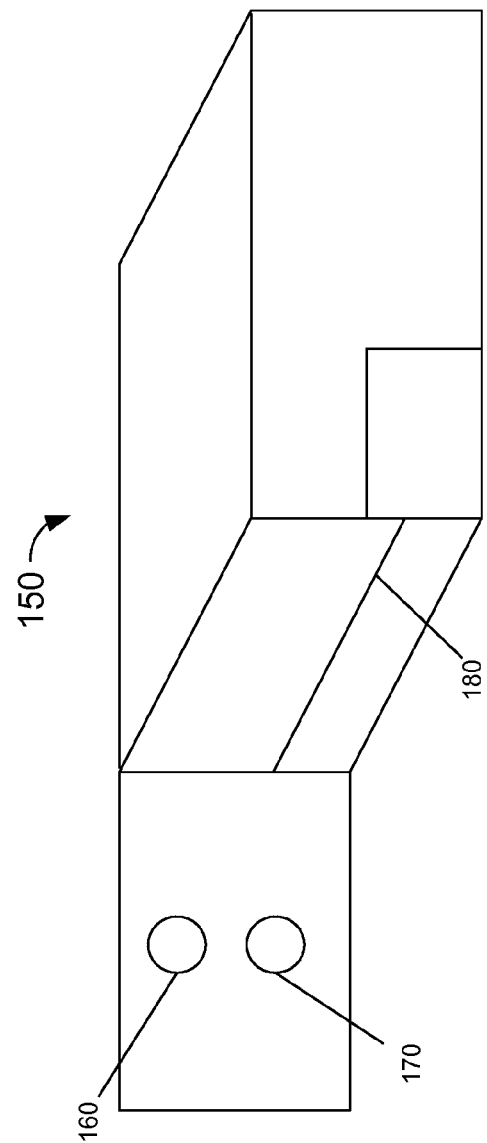
FIG. 2 is a block diagram of a rack-mounted piece of equipment in accordance with an embodiment of the present invention.

Referring now to FIG. 2, shown is a block diagram of a rack-mounted piece of equipment in accordance with an embodiment of the present invention. As shown in FIG. 2, equipment 150 may be a chassis to be adapted in a particular shelf of the rack and can include any type of datacenter equipment. For purposes of discussion assume that the piece of equipment is a server.

Still referring to FIG. 2, note that at a side of the chassis, a protrusion is provided that enables adaptation of the chassis within the rack. On this protrusion, a corresponding photosensor 170 and light source 160 may be provided. In general, light source 160 may provide a source of light to a corresponding photosensor located on the segment of the strip 140 located at the height of the rack at which the chassis is located. Similarly, photosensor 170 can be used to read information from the corresponding light source of the segment. In general, this light source 160 and photosensor 170 may be configured similarly to those discussed above, namely as a set of LEDs having a lens such as a frosted lens covered over it to enable blending and a photosensor. As seen, links 180 may be used to couple the corresponding photosensor and light source to components of the equipment such as a controller, power source and so forth. In many embodiments, the equipment may connect into the rack such that its light source and photosensor is in optical communication with and is covered by the corresponding light source and photosensor of strip segment and thus this light source of the strip may be the only light source visible to datacenter personnel.

Different mechanisms are possible with regard to the datacenter equipment. In some embodiments, the photosensor associated with the equipment may be used to read information from the corresponding light source of the strip and provide that information into the piece of equipment itself. And similarly, the light source associated with the equipment may display a color of light indicated by the piece of equipment to thus provide some type of information back to the datacenter management system. In other embodiments, these equipment-associated photosensor and light source can be used to provide a variety of different information.

As one example, information received from the datacenter management system can be used to cause a particular type of operation in the equipment. For example, in part based on this light information provided in the downstream direction, a piece of equipment can be dynamically changed from one type of equipment to another. For example, a former server-based system such as a cloud server can after some period of time be downgraded to a storage device or another less compute intensive function.

As another example of the use of color information as described herein, when a fault is present in a particular system, the corresponding light source associated with the system can be activated to be of a certain color indicative of a fault (e.g., red). Furthermore, to enable datacenter personnel to more readily ascertain a location of a failure, additional strips in the vicinity of the failing system may provide an indication of a direction towards the failed device. For example, along a long run of racks, a solid, uniform color (e.g., blue) can be lit which, as the direction goes nearer to the failing device, turns to blinking lights and finally to the red light indicating the location of the failed piece of equipment. Of course many other examples are possible.

Another piece of information that can be provided using light sources in accordance with an embodiment of the present invention is device functionality. For example, each type of device present in the datacenter may be associated with a particular color such that a light source associated with a particular piece of equipment may in a steady state be of the corresponding color for the equipment to thus identify to datacenter personnel the type of resource located at that height within the rack.

Different implementations are possible. For example, in one implementation the LEDs can be located on the cabinet, e.g., along a front of the cabinet, and photosensors may be provided on each rack-mounted piece of equipment. This photosensor can detect the color and provide information, e.g. via a wireless access point on the cabinet, to the datacenter management system. In another of implementation, photosensors can be in the cabinet with LEDs on the rack-mounted equipment.

By providing these light sources and sensors, an efficient manner of identifying inventory in place is possible. Furthermore, based on this information datacenter operations can be performed more efficiently, such as degrading the equipment in place, e.g. downgrading a server chassis to a storage server or so forth.

Also, this information can be used in an advanced datacenter implementing an automated storage and retrieval system (AS/RS) to enable robotic or other automated handling of equipment based on the identification of the equipment mounted in the cabinets.

Figure 3:
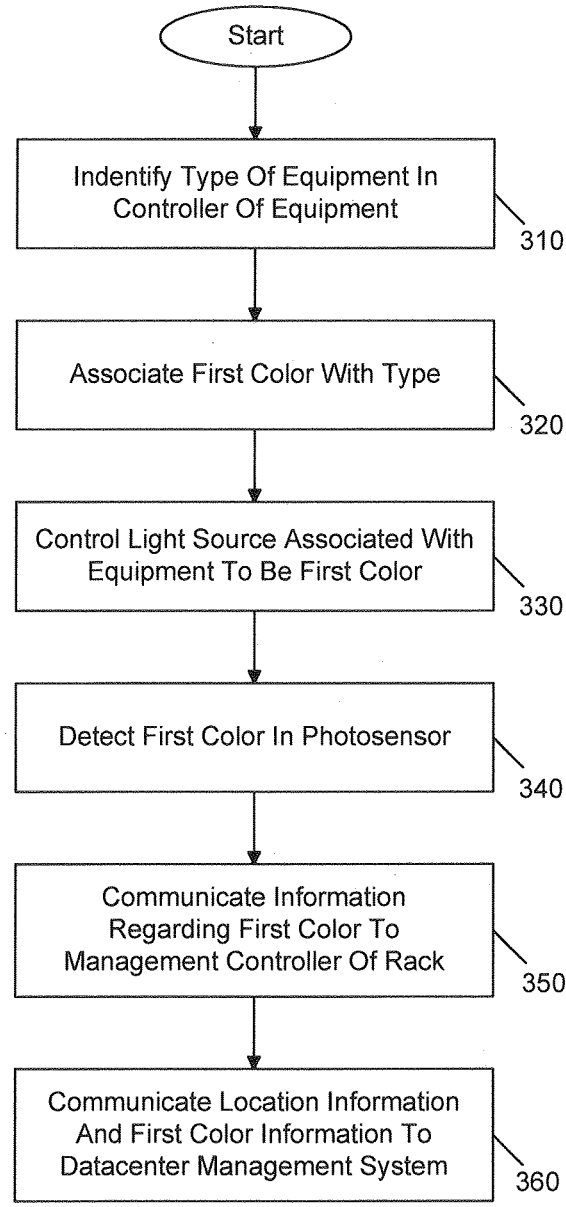
FIG. 3 is a flow diagram of a method for communicating using color information in accordance with an embodiment of the present invention.

Referring now to FIG. 3, shown is a flow diagram of a method for communicating using color information in accordance with an embodiment of the present invention. As shown in FIG. 3, method 300 can be implemented by various components within a datacenter to enable upstream communication of color identity to thus allow at least locality information to be determined by a datacenter manager. Specifically method 300 begins by identifying the type of equipment, which can be performed in a controller of the equipment (block 310). For example, a server computer may include a management controller that performs various operations, including making the determination of the type of system it is, such as a server system of a particular compute variety or so forth.

Next, the controller may associate a first color with the type of equipment (block 320). For example, in an embodiment a mapping table may be present in the controller to associate different equipment types with a given color. Or, a single storage entry may identify the type of equipment and corresponding color. In either event, at block 330 a light source can be controlled to be of this first color. More specifically, this light source may be a light source associated with the piece of equipment, e.g., as present on a front panel of a chassis, and which can be powered, e.g., via a wired connection from a power supply unit of the equipment. This control of the light source can be by communicating a value to one or more LEDs to thus cause a light output of the given color.

Still referring to FIG. 3, next at block 340 this first color can be detected in a photosensor that is configured to detect light from this light source. More specifically this photosensor can be of a segment of a strip present within a rack that is in optical communication with the light source. As such, responsive to this color detection, the photosensor can communicate information regarding this first color to a management controller of the rack (block 350). For example, a wired connection can relay this information and an identification of the photosensor to the control board. In turn, this control board can communicate location information and the first color information to a datacenter management system (block 360). For example, in a wireless implementation, the management control board can communicate a wireless message that includes a MAC address for the board which thus provides location information. This message may further include an identifier for the color. Note that in other embodiments location information can be determined by another mechanism such as a triangulation mechanism. Although shown at this high level in the embodiment of FIG. 3, understand the scope of the present invention is not limited in this regard.

Figure 4:
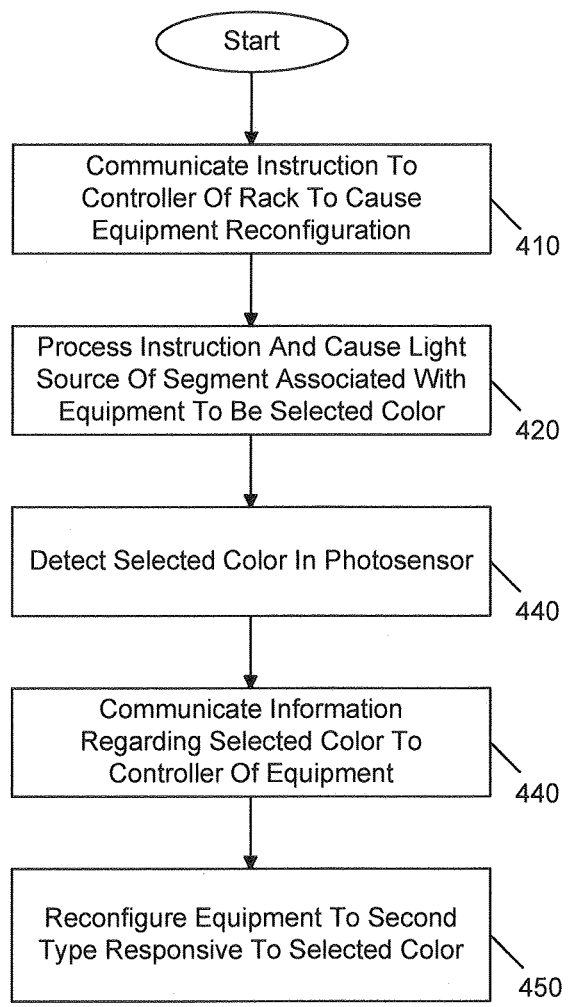
FIG. 4 is a flow diagram of a method for reconfiguring a piece of equipment in accordance with an embodiment of the present invention.

Similar techniques are possible in a downstream direction to receive color information originating from a datacenter management system and perform a given action in a piece of equipment based on that information. Referring now to FIG. 4, shown is a flow diagram of a method for reconfiguring a piece of equipment in accordance with an embodiment of the present invention. Although shown at this high level in FIG. 4 for purposes of equipment reconfiguration, understand that many other types of actions can be taken in a piece of equipment responsive to color information received from a datacenter management system.

As seen in FIG. 4, method 400 begins by communicating an instruction to a controller of a rack to cause equipment reconfiguration (block 410). Assume that this communication is via a wireless communication from the datacenter management system or a wired connection that is thus directed to the management controller of a rack. Note that this communication may be a unicast message only to this controller, or it can be a broadcast message to multiple such controllers. Next at block 420, this instruction can be processed by the management controller to cause a light source of a segment that is associated with the particular piece of equipment to be of a selected color (block 420). For example, the management controller may cause a LED of a strip segment associated with the given piece of equipment to be of a second color.

Next, a photosensor, namely a photosensor that is associated with the piece of equipment, can thus detect this second color (block 430). Control then passes to block 440 where information regarding this second color can be communicated to a controller of the piece of equipment. Based upon this communication of the command to perform a reconfiguration, control passes to block 450 where the equipment can be reconfigured to a second type of equipment responsive to this second color. For example, an in-place downgrade of the equipment from a compute device of a particular level to a lesser compute device, a storage device or to another type of device can occur. Various well known operations can be performed within the piece of equipment to thus perform this reconfiguration.

Embodiments may be implemented in code and may be stored on a non-transitory storage medium having stored thereon instructions which can be used to program a system to perform the instructions. The storage medium may include, but is not limited to, any type of non-transitory storage medium suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a rack including a plurality of rack-mounted devices;
   a strip coupled to a front portion of the rack and including a plurality of segments, each including a light source to correspond with a particular one of the rack-mounted devices where each light source selectively outputs a color out of a plurality of colors; and
   the plurality of rack-mounted devices, each having a photosensor on a portion thereof to be in communication with a corresponding light source, wherein the photosensor is to determine a color of light output by a corresponding light source, wherein a first rack-mounted device is to perform a configuration operation responsive to a particular color of light of its corresponding light source.

2. The apparatus of claim 1, wherein the light source comprises a plurality of light emitting diodes (LEDs) each of a primary color.

3. The apparatus of claim 2, further comprising a lens adapted about the plurality of LEDs to blend the primary colors to obtain the color.

4. The apparatus of claim 1, wherein each of the plurality of segments of the strip further comprises a second photosensor, and wherein the portion of each of the plurality of rack-mounted devices further includes a second light source.

5. The apparatus of claim 4, wherein a color of light output by the second light source is indicative of a type of the corresponding rack-mounted device to enable datacenter personnel to identify the type of the corresponding rack-mounted device.

6. The apparatus of claim 1, wherein the strip is coupled to a management controller of the rack.

7. The apparatus of claim 6, wherein the management controller of the rack is to wirelessly communicate with a datacenter management system, wherein the datacenter management system is to communicate information to the management controller to cause a first color to be output by the light source of a first segment of the strip.

8. The apparatus of claim 7, wherein responsive to the first color, the corresponding rack-mounted device is to perform a reconfiguration to a different type of resource to enable a downgrade of the corresponding rack-mounted device to a less compute intensive function.

9. A method comprising:
   controlling a light source associated with a rack-mounted device of a rack to be of a first color to identify that the rack-mounted device is of a first type of device;
   detecting the first color in a photosensor associated with a segment of the rack including the rack-mounted device and communicating information regarding the first color to a management controller of the rack;
   communicating location information regarding the rack and the first color information to a datacenter management system from the management controller;
   identifying a failure in the rack-mounted device, and controlling the light source to be of a second color to identify the failure in the rack-mounted device;
   detecting the second color in the photosensor associated with the rack segment and communicating information regarding the second color to the management controller of the rack;
   communicating the location information regarding the rack and the second color information to the datacenter management system from the management controller to provide a fault indication; and
   causing, a first plurality of racks located in a first location in relation to the rack and comprising a strip having a plurality of light sources, to be a first given color, and causing, a second plurality of racks located in a second location in relation to the rack and comprising a strip having a plurality of light sources, to be a second given color, to enable datacenter personnel to identify an indication of a direction to the rack having the failure in the rack-mounted device.

10. The method of claim 9, further comprising identifying the type of the rack-mounted device within a controller of the rack-mounted device.

11. The method of claim 10, further comprising associating the first color with the type via a mapping table stored in the controller.

12. The method of claim 9, further comprising communicating the location information and the first color information to the datacenter management system wirelessly to provide inventory information regarding the rack.

13. The method of claim 12, wherein the location information comprises a MAC address of a wireless module of the rack.

14. A system comprising:
   a datacenter rack including a plurality of rack-mounted devices each associated with a photosensor;
   a strip coupled to a first portion of the rack and including a plurality of segments, each associated with a light source for communication with a corresponding one of the photosensors, wherein the corresponding photosensor is to detect the information output by the corresponding light source; and
   a datacenter management system coupled to the datacenter rack via a management controller of the datacenter rack, wherein the datacenter management system is to communicate information to a first rack-mounted device of the plurality of rack-mounted devices via a first of the light sources and a first of the photosensors associated with the first rack-mounted device, wherein the first rack-mounted device is to perform a configuration operation responsive to the information, wherein the information includes a color of light detected by the first photosensor.

15. The system of claim 14, wherein the first light source comprises a plurality of light emitting diodes (LEDs) each of a primary color.

16. The system of claim 15, further comprising a lens adapted about the plurality of LEDs to blend the primary colors to obtain the color of light.

* * * * *